(12) United States Patent
Ekawa

(10) Patent No.: US 6,853,661 B2
(45) Date of Patent: Feb. 8, 2005

(54) GAIN-COUPLED SEMICONDUCTOR LASER DEVICE LOWERING BLUE SHIFT

(75) Inventor: Mitsuru Ekawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/366,607

(22) Filed: Feb. 14, 2003

(65) Prior Publication Data

US 2003/0198266 A1 Oct. 23, 2003

(30) Foreign Application Priority Data

Apr. 23, 2002 (JP) ........................................ 2002-120152

(51) Int. Cl.⁷ ................................................ H01S 5/00
(52) U.S. Cl. ............................ 372/43; 372/44; 372/45; 372/46; 372/47; 372/48; 372/49; 372/50; 372/99; 372/102
(58) Field of Search ............................. 372/43–50, 99, 372/102

(56) References Cited

U.S. PATENT DOCUMENTS 5,608,572 A * 3/1997 Nitta et al. ................. 359/344
6,026,110 A * 2/2000 Makino ....................... 372/96
6,614,059 B1 * 9/2003 Tsujimura et al. .......... 257/101

* cited by examiner

*Primary Examiner*—Mingun Oh Harvey
*Assistant Examiner*—Delma R. Flores-Ruiz
(74) *Attorney, Agent, or Firm*—Armstrong, Kratz, Quintos, Hanson & Brooks, LLP

(57) ABSTRACT

A low clad layer made of semiconductor of a first conductivity type is formed on a semiconductor substrate. An active layer is formed on the low clad layer. The active layer is constituted by alternately stacking a strained well layer and a barrier layer. A partial or whole thickness of the active layer is periodically removed along a first direction parallel to the surface of the semiconductor substrate to form a diffraction grating. A filler made of semiconductor is embedded in the removed region. Strain of the strained well layer and strain of the filler have the same sign. An upper clad layer is formed on the active layer and filler and made of semiconductor of a second conductivity type. A semiconductor laser device is provided which has a smaller shift of spontaneous emission or PL even if a diffraction grating is formed in an active layer.

14 Claims, 4 Drawing Sheets

GAIN-COUPLED SEMICONDUCTOR LASER DEVICE LOWERING BLUE SHIFT

CROSS REFERENCE TO RELATED APPLICATION

This application is based on and claims the benefit of priority from the Japanese Patent Application No. 2002-120152, filed on Apr. 23, 2002, the entire contents of which are incorporated herein by reference.

BACKGROUND OF THE INVENTION

A) Field of the Invention

The present invention relates to a semiconductor laser device, and more particularly to a gain-coupled distributed feedback type semiconductor laser device having a diffraction grating formed in a strained multi-quantum-well structure.

B) Description of the Related Art

Recent rapid spread of the Internet and information processing technology is considerably increasing the capacity of information communications. It is urgent that an optical communication network of wavelength division multiplexing (WDM) suitable for a large communication capacity is configured. A distributed feedback (DFB) laser used for a light source in WDM is required to have high speed and low cost, to say nothing of single wavelength and high output operation. In order to realize low cost, it is preferable to monolithically integrate optical components such as a semiconductor laser device, an optical modulator, an optical amplifier and an optical multiplexer/demultiplexer. A semiconductor laser device used in an optical apparatus with monolithically integrated optical components is required to have a high tolerance to back reflected light.

A λ/4 phase shift DFB laser device is in practical use as a semiconductor laser excellent in single wavelength. This laser device is of a refractive-index-coupled type and has the structure that the phase of a diffraction grating formed near a substrate or active layer is shifted by π (corresponding to a quarter wavelength in propagation medium). An antireflection film is formed on both end faces of the optical resonator so that stable single wavelength oscillation can be realized. However, since the antireflection film is formed on both end faces, it is difficult to obtain high output.

A gain-coupled distributed feedback laser device (gain-coupled DFB laser device) has been paid attention, which periodically changes the gain in the direction of light propagation by forming a diffraction grating in the active layer itself having a strained multi-quantum well structure. In this laser device, some regions of the active layer in the depth direction are periodically removed along the direction of light propagation and the remaining convex regions are periodically disposed to form the diffraction grating.

In this laser device, since antinodes of a standing wave are positioned at large gain regions (convex regions of the active layer), oscillation can be reliably made at a single wavelength without shifting the phase of the diffraction grating. This laser device is suitable for high output because it can oscillate at a single wavelength even if one end face of the optical resonator is coated with material having a high reflectivity. It has been experimentally confirmed that the characteristics of a gain-coupled DFB laser device changes are less influenced by back reflected light. Gain-coupled DFB laser devices are expected as laser devices excellent in single wavelength, high output operation and tolerance to back reflected light.

It has been reported that in conventional gain-coupled DFB laser devices, the wavelength of spontaneous emission or photoluminescence (PL) in a convex region of an active layer formed with a diffraction grating shifts (blue-shifts) to the shorter wavelength side by about several tens meV from the wavelength of the active layer before the diffraction grating is formed.

SUMMARY OF THE INVENTION

An object of this invention is to provide a semiconductor laser device having a smaller shift of spontaneous emission or PL even if a diffraction grating is formed in an active layer.

According to one aspect of the present invention, there is provided a semiconductor laser device comprising: a low clad layer made of semiconductor material of a first conductivity type and formed on or over a semiconductor substrate; an active layer formed on or over the low clad layer, the active layer being constituted by alternately stacking a strained well layer and a barrier layer having a larger bandgap than the strained well layer, and a partial or whole thickness of the active layer being periodically removed along a first direction parallel to a surface of the semiconductor substrate to form a diffraction grating; a filler made of semiconductor material embedded in the removed region of the active layer, strain of the strained well layer and strain of the filler having a same sign; and an upper clad layer formed on or over the active layer and the filler and made of semiconductor material of a second conductivity type opposite to the first conductivity type.

By using the above-described material as the material of the filler, it becomes possible to suppress strain relaxation when a diffraction grating is formed in an active layer including strained quantum well layers and fillers are formed in the diffraction grating. Accordingly, a blue shift of spontaneous emission or PL can be lowered and the device characteristics and reliability can be improved more than conventional gain-coupled DFB laser devices.

DESCRIPTION OF THE PREFERRED EMBODIMENTS

Prior to describing an embodiment of the invention, description will be made on the reason why the PL wavelength shifts to blue if a diffraction grating is formed in a conventional gain-coupled DFB laser device.

Figure 4:
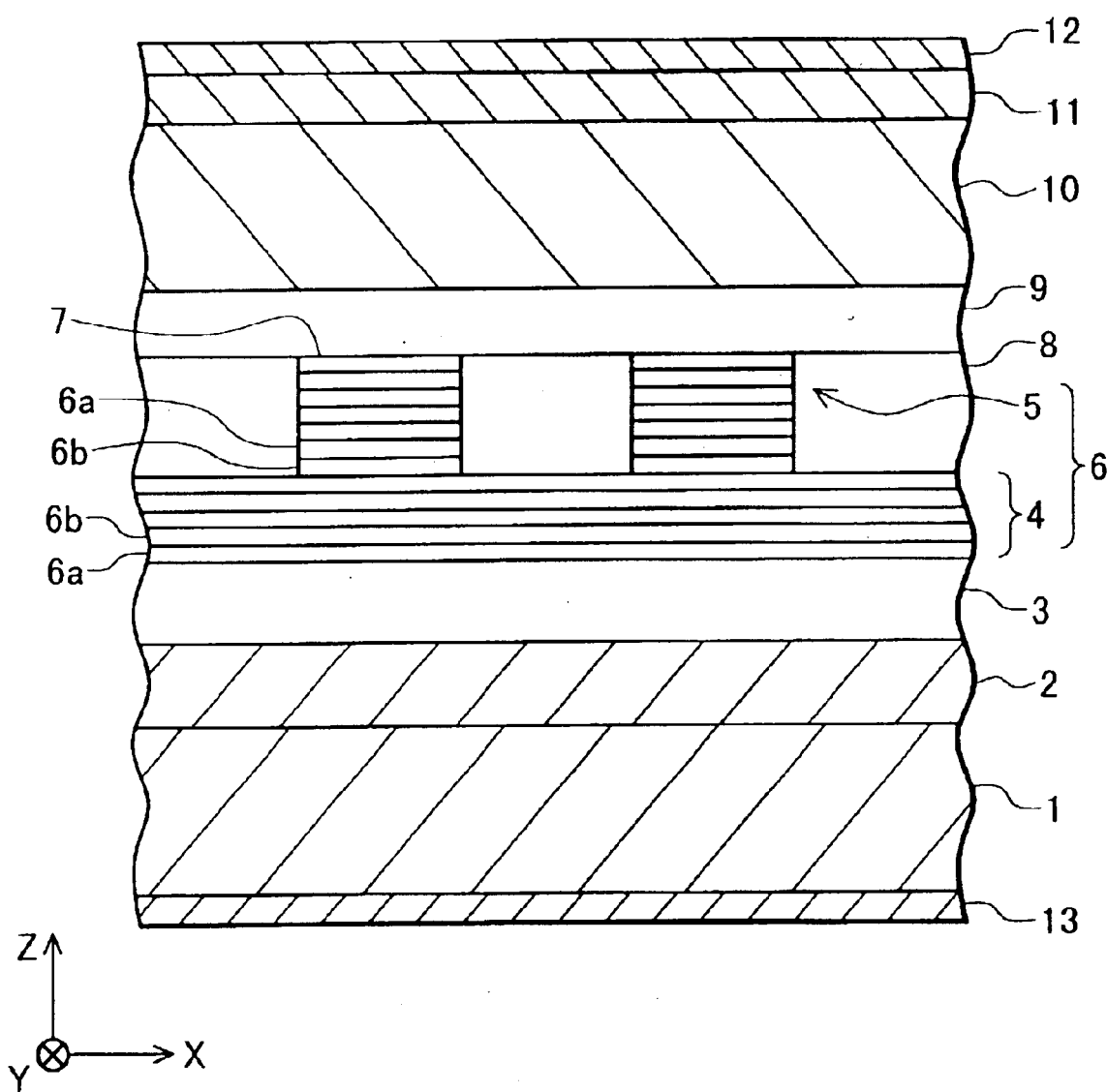
FIG. 4 is a partial cross sectional view of a conventional gain-coupled DFB laser device taken along a line parallel to the direction of light propagation.

FIG. 4 shows a partial cross sectional view of a conventional gain-coupled DFB laser device. A lower clad layer 2 made of n-type InP and having a thickness of 300 nm is formed on a semiconductor substrate 1 made of InP having an n-type conductivity. The crystal plane of the upper surface (principal surface) of the semiconductor substrate 1 is the (0 0 1) plane. An XYZ rectangular coordinate system is incorporated whose XY plane is parallel to the upper surface of the semiconductor substrate 1 and whose Z axis is a thickness direction of the substrate 1. The X axis direction is the [1 1 0] direction of the substrate 1 and the Y axis is the [−1 1 0] direction. The Z axis direction is the [0 0 1] direction. A number in the Miller indices with a minus sign means the number with an over-bar.

On the lower clad layer 2, a lower optical guide layer 3 is formed which is made of undoped InGaAsP and 50 nm thick. The PL wavelength in the lower optical guide layer 3 is 1.15 μm. On the lower optical guide layer 3, an active layer 6 having a multi-quantum-well structure with a diffraction grating is formed.

The active layer 6 is constituted of a flat active layer 4 on the side of the lower optical guide layer 3 and a plurality of convex active layers 5 formed on the flat active layer 4. The convex active layers 5 are periodically distributed along the X direction. The distribution period of convex active layers 5 is determined from a Bragg wavelength or oscillation wavelength and an equivalent refractive index of an optical waveguide.

The flat active layer 4 has the structure that a barrier layer 6a of 10 nm in thickness and a strained quantum well layer 6b of 6 nm in thickness are alternately stacked. Similarly, the convex active layer 5 has the structure that a barrier layer 6a of 10 nm in thickness and a strained quantum well layer 6b of 5 nm in thickness are alternately stacked. The strained quantum well layer 6b is made of InGaAsP having a bandgap corresponding to a wavelength of 1.56 μm, whereas the barrier layer 6a is made of InGaAsP having a bandgap corresponding to a wavelength of 1.3 μm. On the upper surface of the convex active layer 5, a cover film 7 is formed which is made of undoped InP and is 20 nm thick. A concave region is defined between adjacent two convex active layers 5. A filler 8 made of undoped InP is embedded in the concave region. The upper surface of the filler 8 is approximately flush with the upper surface of the cover film 7.

Sequentially laminated on the cover films 7 and fillers 8 are an upper optical guide layer 9 made of undoped InGaAsP and having a thickness of 50 nm, an upper clad layer 10 made of p-type InP and having a thickness of 3 μm and a contact layer 11 made of p-type InGaAs and having a thickness of 500 nm. At least the active layer 6 and layers at upper levels than the active layer are made to have a straight mesa structure extending in the X direction. Although not shown in FIG. 4, a current blocking structure is formed on both sides of the mesa structure (on front and back sides of the drawing sheet of FIG. 4). The current blocking structure may be the structure having a p-type InP layer, an n-type InP layer and a p-type InP layer stacked in this order or a high resistance InP layer doped with iron (Fe).

An upper electrode 12 of AuZn is formed on the contact layer 11, and a lower electrode 13 of AuGe is formed on the bottom surface of the semiconductor substrate 1. As voltage is applied across the upper and lower electrodes 12 and 13, with the positive voltage applied to the upper electrode 12, holes are injected into the active layer 6 via the upper electrode 12 and electrons are injected into the active layer 6 via the lower electrode 13.

The strained quantum well layer 6b and barrier layer 6a are formed on the underlying semiconductor substrate 1 through coherent growth. Coherent growth means such a crystal growth as the lattice constants of the strained quantum well layer 6b and barrier layer 6a in the X and Y directions become equal to the lattice constant of the surface of the underlying layer. The lattice constants of the strained quantum well layer 6b and barrier layer 6a in the X and Y directions are therefore strained so as to become equal to the lattice constant of the surface of the semiconductor substrate 1. Since stress is not applied to the flat active layer 4 along the Z direction, lattice deformation to be determined by a Poisson's ratio of the material of the flat active layer 4 occurs along the Z direction.

For example, a lattice constant $a_{zw}$ in the Z direction of the strained quantum well layer 6b after lattice deformation is given by:

$$a_{zw} = a_w + (a_w - a_s)v_w$$

where $v_w$ is a Poisson's ratio of the strained quantum well layer 6b, $a_w$ is a lattice constant of the strained quantum well layer 6b when there is no strain, and $a_s$ is a lattice constant of the surface of the underlying semiconductor substrate 1.

If the lattice constants of the strained quantum well layer 6b and barrier layer 6a in a bulk state (no strain state) are larger than the lattice constant of the semiconductor substrate 1, the strained quantum well layer 6b and barrier layer 6a are subjected to compression stress so that the layers shrink in the X and Y directions and extend in the Z direction. Conversely, if the lattice constants of the strained quantum well layer 6b and barrier layer 6a in the bulk state are smaller than the lattice constant of the semiconductor substrate 1, the strained quantum well layer 6b and barrier layer 6a are subjected to tensile stress so that the layers extend in the X and Y directions and shrink in the Z direction. In the example shown in FIG. 4, the strained quantum well layer 6b extends in the Z direction.

The convex active layer 5 is also subjected to stress in the Z direction so that the lattice constant of the layer becomes equal to the lattice constant of the filler 8 in the Z direction. In the example shown in FIG. 4, since the filler 8 is in lattice matching with the surface of the underlying layer, the lattice constant of the filler 8 in the Z direction is smaller than the lattice constant of the convex active layer 5 in the Z direction. Therefore, the filler 8 applies compression stress to the convex active layer 5 in the Z direction so that the convex active layer 5 shrinks in the Z direction. By the influence of shrink strain in the Z direction, the convex active layer 5 is subjected to such a strain as the lattice constant of the convex active layer 5 in the X direction becomes longer than the lattice constant of the semiconductor substrate 1. Namely, strain of the convex active layer 5 is relaxed.

A blue shift of the PL wavelength of the convex active layer 5 from the PL wavelength before strain relaxation is thought to result because of the strain relaxation of the convex active layer 5. This blue shift amount is dependent upon a strain relaxation amount. The strain relaxation amount is considered to be dependent upon a diffraction grating period and a diffraction grating duty (a length of the convex active layer 5 in the X direction divided by the diffraction grating period).

Various problems arise from this strain relaxation phenomenon. A first problem is a difficulty in controlling detuning. An operation performance in a wide temperature range of a DFB laser device is guaranteed by controlling detuning which is defined by a difference between an oscillation wavelength and a wavelength at a peak gain. However, if the strain amount of a strained multi-quantumwell layer and the period and duty of a diffraction grating are not controlled precisely during manufacture processes, a variation in PL wavelengths exists after the filler 8 is embedded, and detuning controllability is degraded.

A second problem is a lowered device performance. For conventional laser devices having a strained multi-quantum-well structure or a strain compensated multi-quantum-well structure, a low threshold current value and a high efficiency have been realized by changing the band structure by eliminating degeneracy of a valence band through the utilization of strain effects. Such strain effects are weakened if strain of the convex active layer 5 is relaxed.

A third problem is a lowered device reliability. Dislocation is likely to occur during the strain relaxation process of the convex active layer 5. If dislocation occurs, the device reliability is lowered.

Next, description will be made on a laser device according to an embodiment of the invention, the laser device being able to solve the above-described problems.

Figure 1A:
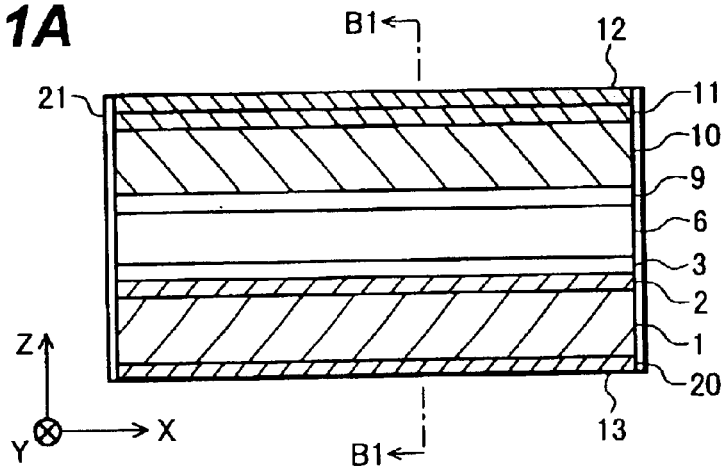
FIG. 1A is a cross sectional view of a semiconductor laser device taken along a line parallel to the direction of light propagation according to an embodiment of the invention.

FIG. 1A is a cross sectional view of a semiconductor laser device according to the embodiment of the invention. A lower clad layer 2, a lower optical guide layer 3, an active layer 6, an upper optical guide layer 9, an upper clad layer 10 and a contact layer 11 are sequentially stacked in this order on a semiconductor substrate 1. An upper electrode 12 is formed on the contact layer 11 and a lower electrode 13 is formed on the bottom surface of the semiconductor substrate 1. This lamination structure will be detailed later with reference to FIG. 2.

An XYZ rectangular coordinate system is incorporated whose XY plane is parallel to the upper surface of the semiconductor substrate 1 and whose Z axis is a thickness direction of the substrate 1. It is assumed that the X direction is the [1 1 0] direction, the Y direction is the [−1 1 0] direction and the Z direction is the [0 0 1] direction. The X direction corresponds to a direction of light propagation. An antireflection film 20 is formed on one end face, along the X direction, of the lamination structure from the semiconductor substrate 1 to the contact layer 11, and a high reflection film 21 is formed on the other end face. In the oscillation wavelength range of the active layer 6, the reflectivity of the end face formed with the high reflection film 21 is higher than the reflectivity of the end face formed with the antireflection film 20.

Figure 1B:
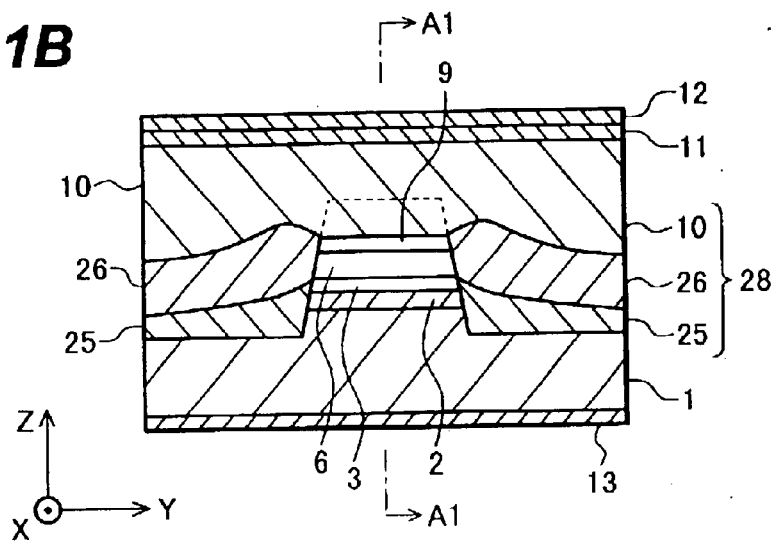
FIG. 1B is a cross sectional view taken along a line perpendicular to the direction of light propagation.

FIG. 1B is a cross sectional view taken along one-dot chain line B1—B1 shown in FIG. 1A. A cross sectional view taken along one-dot chain line A1—A1 shown in FIG. 1B corresponds to FIG. 1A. A lamination structure from a surface layer of the semiconductor substrate 1 to a partial region of layers up to the upper clad layer 10 is a straight mesa structure extending in the X direction. On both sides of the mesa structure, a current blocking structure 28 is disposed.

The current blocking structure 28 is a lamination structure of a p-type InP layer 25, an n-type InP layer 26 and a p-type InP layer (upper clad layer) 10 stacked in this order. An upper electrode 12 is formed on the contact layer 11.

Figure 2:
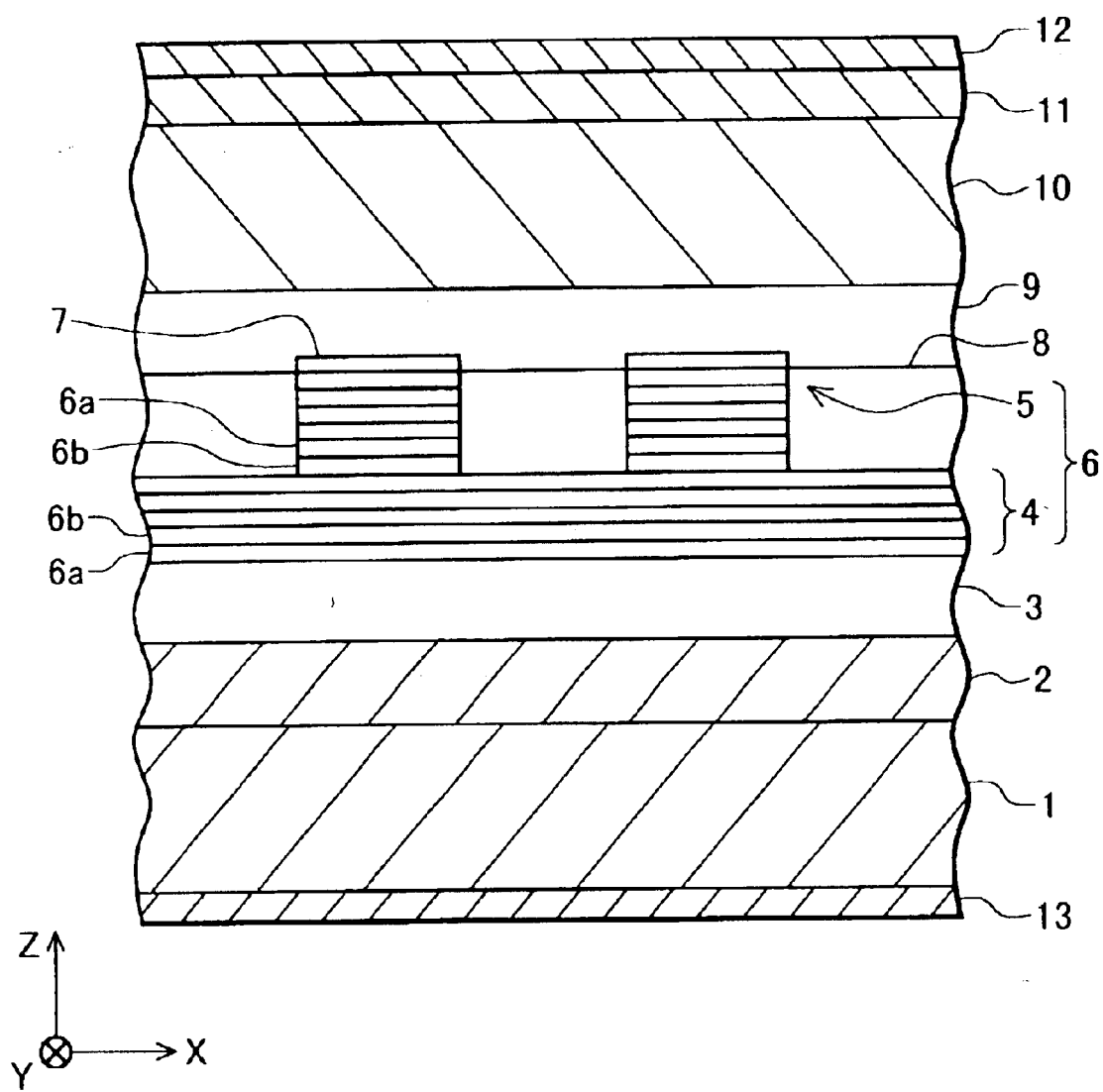
FIG. 2 is a detailed partial cross sectional view of the semiconductor laser device shown in FIG. 1 and taken along the line parallel to the direction of light propagation.

FIG. 2 is a detailed partial cross sectional view taken along one-dot chain line A1—A1 shown in FIG. 1B. Description will be made on different points from the conventional gain-coupled DFB laser device shown in FIG. 4.

The filler 8 of the conventional laser device is made of InP which is lattice-matched with the InP semiconductor substrate 1. In contrast, the filler 8 of the gain-coupled DFB laser device of the embodiment is made of $InAs_{0.1}P_{0.9}$. The upper surface of the filler 8 is flush with the height at the boundary between the convex active layer 5 and cover film 7. Under these conditions, strain relaxation of the convex active layer 5 can be effectively suppressed.

With reference to FIG. 2, a method of manufacturing the gain-coupled DFB laser device of the embodiment will be described.

On the upper surface (principal surface) of the semiconductor substrate 1 of n-type InP, the lower clad layer 2 made of n-type InP and having a thickness of 300 nm is formed by metal organic vapor phase epitaxial (MOVPE) growth. In the following processes, each compound semiconductor layer is formed by MOVPE growth unless otherwise specifically noted. On the lower clad layer 2, the lower optical guide layer 3 of undoped InGaAsP is formed. The thickness of the lower optical guide layer 3 is 50 nm and its PL wavelength is 1.15 μm.

On the lower optical guide layer 3, the barrier layer 6a of undoped InGaAsP and a strained quantum well layer 6b of undoped InGaAsP are alternately grown coherently.

The numbers of barrier layers 6a and strained quantum well layers 6b are six and five, respectively. The thickness of the strained quantum well layer 6b is 6 nm and the thickness of the barrier layer 6a is 10 nm. The strain amount $\epsilon_W$ of the strained quantum well layer 6b is −0.8%. A negative strain amount means that the strain is compression strain. A positive strain amount means that the strain is tensile strain. Lattice deformation determined by a Poisson's ratio occurs along the Z direction so that the lattice constant of the strained quantum well layer 6b in the Z direction becomes longer. The barrier layer 6b is in lattice matching with the underlying InP and its strain amount $\epsilon_B$ is 0%.

An average strain amount $\epsilon_M$ of the strained multi-quantum-well structure is defined as:

$$\epsilon_M = (L_B \times \epsilon_B + L_W \times \epsilon_W)/(L_B + L_W)$$

where $L_B$ and $L_W$ are the thicknesses of the barrier layer 6a and strained quantum well layer 6b, respectively. Namely, the average strain amount $\epsilon_M$ is an average of the strain amount $\epsilon_B$ of the barrier layer 6a and the strain amount $\epsilon_W$ of the strained quantum well layer 6b weighted by the thicknesses of the barrier layer 6a and strained quantum well layer 6b.

In this embodiment, since $L_B=10$ nm, $L_W=6$ nm, $\epsilon_B=0\%$ and $\epsilon_W=-0.8\%$, the average strain amount $\epsilon_M$ is −0.3%.

On the uppermost barrier layer 6a, the cover layer 7 made of undoped InP and having a thickness of 20 nm is formed. This cover layer 7 functions as a protective layer for the active layer 6. Photoresist is coated on the cover layer 7, and a resist pattern for a diffraction grating having a period of 240 nm in the X direction is formed by photolithography using two-beam interference exposure.

By using this resist pattern as a mask, the lamination from the cover layer 7 to the third strained quantum well layer 6b as counted from the upper most strained quantum well layer is etched by dry etching or wet etching. With these etching, the active layer 6 made of the flat active layer 4 and convex active layers 5 is formed. The height of the convex active layer 5 (depth of the diffraction grating) is about 48 nm.

After the resist pattern is removed, the filler 8 of $InAs_{0.1}P_{0.9}$ is grown in the concave regions between adjacent convex active layers 5 until the upper surface of the filler 8 reaches the boundary between the active layer 5 and cover layer 7. By controlling the film forming conditions of MOVPE, it becomes possible to preferentially grow InAsP in the concave regions by hardly growing InAsP on the cover layer 7. As the filler 8 is grown coherently on the surface of the underlying layer, the strain amount takes a value of −0.3%. This strain amount is equal to the average strain amount of the active layer 6. Since InAsP is mixed crystal regarding group V elements, the composition modulation of InAsP embedded in the concave region is small and the crystal quality is good.

On the cover layers 7 and fillers 8, the upper optical guide layer 9 made of undoped InGaAsP and having a thickness of 50 nm is formed. Instead of the optical guide layer, an undoped InP layer may be formed which functions as a portion of the clad layer. On the upper optical guide layer 9, a first upper clad layer made of p-type InP and having a thickness of 0.5 μm is formed.

By using an SiO₂ pattern as a mask, the lamination from the first upper clad layer to the surface layer of the semiconductor substrate 1 is partially etched to form the straight mesa structure shown in FIG. 1B. On both sides of the mesa structure, a p-type InP layer 25 and an n-type InP layer 26 are buried. After the SiO₂ pattern is removed, a second upper clad layer 26 made of p-type InP and having a thickness of 2.5 μm is additionally grown (the upper clad layer 10 is therefore 3 μm thick). On the upper clad layer 10, the contact layer 11 made of p-type InGaAs and having a thickness of 500 nm is formed. The pnpn-type current blocking structure 28 is therefore formed on both sides of the mesa structure. The upper electrode 12 is formed by vapor-depositing AuZn on the surface of the contact layer 11. The lower electrode 13 is formed by vapor-depositing AuGe on the bottom surface of the semiconductor substrate 1.

Figure 1C:
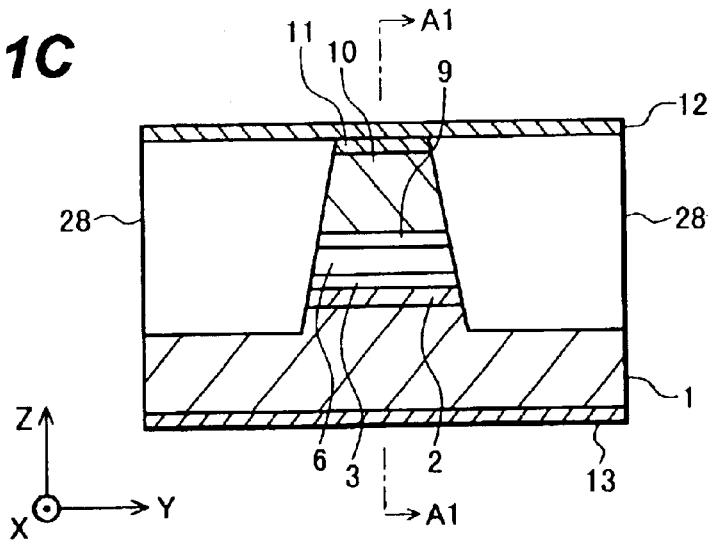
FIG. 1C is a cross sectional view of another semiconductor laser device.

FIG. 1C shows a semiconductor laser device having the current blocking structure 28 made of high resistance InP doped with Fe. The cross sectional view taken along line A1—A1 shown in FIG. 1C corresponds to FIG. 1A. A method of manufacturing the semiconductor laser device shown in FIG. 1C will be described.

Processes up to forming an upper optical guide layer 9 shown in FIG. 2 are the same as the manufacture processes of forming the semiconductor laser device shown in FIG. 1B. On the upper guide layer 9, an upper clad layer 10 made of p-type InP and having a thickness of 1.5 μm is formed. On the upper clad layer 10, a contact layer 11 made of p-type InGaAs and having a thickness of 500 nm is formed.

By using an SiO₂ pattern as a mask, the lamination from the contact layer 11 to the surface layer of the semiconductor substrate 1 is partially etched to form the straight mesa structure extending along the direction perpendicular to the drawing sheet of FIG. 1C. On both sides of the mesa structure, a current blocking structure 28 made of high resistance InP doped with Fe is buried. On the surfaces of the contact layer 11 and current blocking structures 28, AuZn is vapor-deposited to form an upper electrode 12. On the bottom surface of the semiconductor substrate 1, AuGe is vapor-deposited to form a lower electrode 13.

Since the current blocking structure 28 of InP doped with Fe has a high resistance, carriers can be preferentially injected into the active layer 6.

Figure 3A:
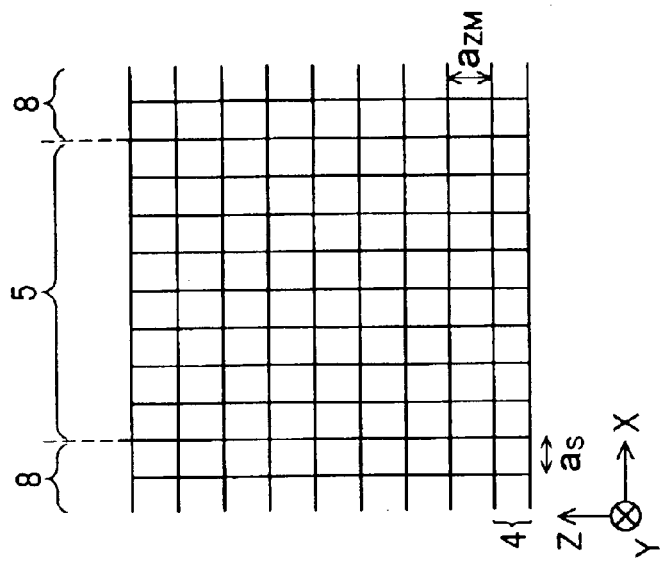
FIGS. 3A to 3C are schematic diagrams illustrating lattice deformation of a convex active layer of the semiconductor laser device of the embodiment.
Figure 3B:
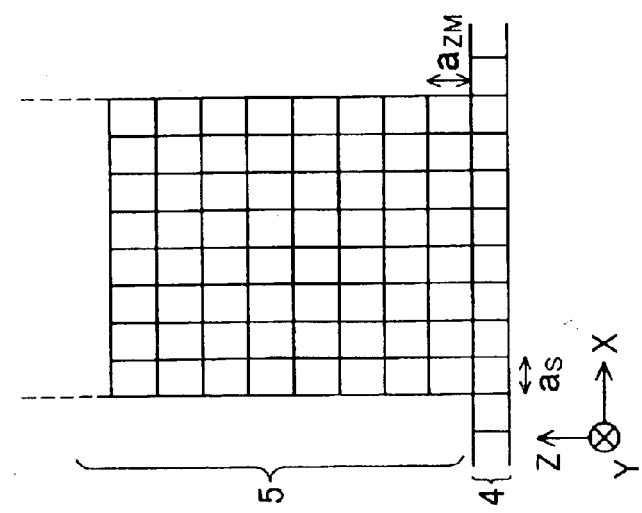
Figure 3C:
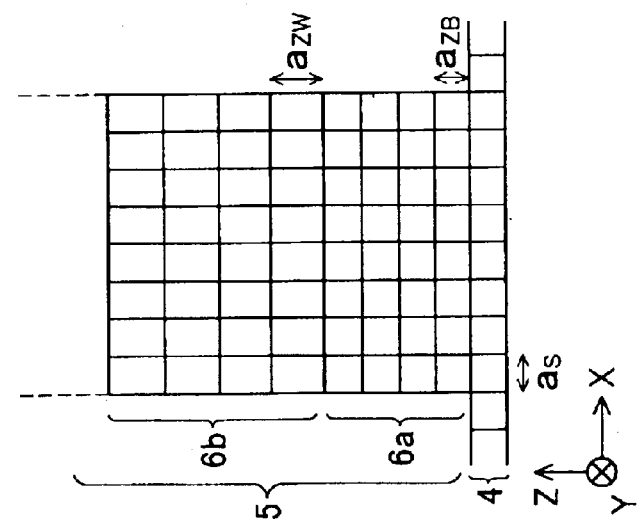

Next, with reference to FIGS. 3A to 3C, the strain amount of the convex active layer 5 shown in FIG. 2 will be described. FIGS. 3A to 3C schematically show the crystal lattice state in the XZ plane of the convex active layer 5.

As shown in FIG. 3A, the convex active layer 5 is disposed on the flat active layer 4. Since the flat active layer 4 and convex active layer 5 are grown coherently on the InP substrate, the lattice constants of these layers in the X and Y directions are equal to the lattice constant as of the InP substrate. Since the barrier layer 6a is in lattice matching with the InP substrate the lattice constant $a_{ZB}$ of the barrier layer 6a in the Z direction is equal to the lattice constant when there is no strain.

The lattice constant of the strained quantum well layer 6b when there is no strain is larger than the lattice constant of the InP substrate. Therefore, the strained quantum well layer 6b under coherent growth is subjected to compression stress along the X and Y directions and strained until the lattice constant of the strained quantum well layer 6b becomes equal to the lattice constant as of the InP substrate. As described earlier, this strain amount is −0.8%. Therefore, the lattice constant $a_{ZW}$ of the strained quantum well layer 6b in the Z direction becomes longer and larger than the lattice constant when there is no strain.

FIG. 3B shows the lattice state when it is assumed that the barrier layer 6a and strained quantum well layer 6b are a single layer having an average of the strain amounts of the two layers weighted by the thicknesses of the two layers. This average strain amount is −0.3% as already described. It is therefore possible to assume that the convex active layer 5 is a single layer having a uniform strain amount of −0.3% in the X and Y directions. If the convex active layer 5 is assumed to be a single layer, by using the lattice constants $a_{ZB}$ and $a_{ZW}$ in the Z direction shown in FIG. 3A, the average lattice constant $a_{ZM}$ in the Z direction is given by:

$$a_{ZM}=(L_B a_{ZB}+L_W a_{ZW})/(L_B+L_W)$$

where $L_B$ and $L_W$ are the thicknesses of the barrier layer 6a and strained quantum well layer 6b, respectively.

As shown in FIG. 3C, the filler 8 of $InAs_{0.1}P_{0.9}$ is in contact with the side wall of the convex active layer 5. Since the strain amount of the filler 8 is also −0.3%, the lattice constant of the filler 8 in the Z direction becomes equal to the average lattice constant $a_{ZM}$ of the convex active layer 5 in the Z direction shown in FIG. 3B. Each of the barrier layer 6a and strained quantum well layer 6b in the convex active layer 8 is subjected to stress applied from the filler 8 in the Z direction. However, since the average lattice constant $a_{ZM}$ of the convex active layer 5 in the Z direction is equal to the lattice constant of the filler 8 in the Z direction, an average stress in the entirety of the convex active layer 5 applied in the Z direction is almost zero. Strain relaxation of the convex active layer 5 occurs scarcely because of the existence of the filler 8. Namely, the strain state of the convex active layer 5 is maintained to be approximately the same strain state as that of the flat active layer 4. Blue shift of the PL wavelength to be caused by the diffraction grating formed in the active layer 5 hardly occurs.

A gain-coupled DFB laser device of the above-described embodiment was manufactured. The PL wavelength and the peak position of an X-ray diffraction pattern after the filler 8 was buried, scarcely changed from those before the filler 8 was buried. It was therefore confirmed that even after the filler 8 was buried, the strain state of the convex active layer 5 was maintained unchanged from the strain state of the flat active layer 4. As compared to a conventional laser device having the filler 8 made of InP, the device performance such as oscillation threshold current and radiation efficiency was improved. A burn-in degradation test was performed, and degradation during operation was found scarcely.

In the embodiment, although the average strain amount of the active layer 6 is made approximately equal to the strain amount of the filler 8, the strain amounts are not necessarily required to be made precisely equal. If only the sign of them is the same, the strain relaxation of the convex active layer 5 is expected to be suppressed. It is expected to suppress the strain relaxation amount if the strain amount of the filler 8 is set 0.8 time or more and 1.2 times or less the average strain amount of the active layer 6.

In the embodiment, although the direction along which the straight mesa structure extends, i.e., the light propagation direction, is set to the [1 1 0] direction of the InP semiconductor substrate 1, the direction may be set to the [−1 1 0] direction perpendicular to the [1 1 0] direction, or the direction oblique to these directions.

Also in the embodiment, although the active layer 6 is made of InGaAsP, other compound semiconductors may also be used. InGaAs, AlInGaAs or the like may be used if the material of the substrate is InP. In this case, the material of the filler 8 may be InGaAsP, AlGaInAs or the like. If the substrate material is InP and the strain of the strained quantum well layer is compression strain, InAsP can be used as the material of the filler. If the substrate material is InP and the strain of the strained quantum well layer is tensile strain, InGaP can be used as the material of the filler.

As the material of the active layer 6, AlGaAs, InGaP, AlGaInP or the like may be used if the substrate material is GaAs. In this case, InGaAsP, AlGaInP, InGaP or the like may be used as the material of the filler 8.

Also in the embodiment, although the diffraction grating is formed only in the upper region of the active layer 6, a through-type diffraction grating may be formed by etching the whole thickness of the active layer 6. In this case, the flat active layer 4 shown in FIG. 2 does not exist and the convex active layer 5 is disposed directly on the surface of the lower optical guide layer 3.

In the embodiment, although a gain-coupled DFB laser device has been described illustratively, the structure of the active layer 6 and filler 8 of the embodiment may be applied to a quantum wire laser device in which the diffraction grating period is shortened to such an extent that the quantum effects occur.

The present invention has been described in connection with the preferred embodiments. The invention is not limited only to the above embodiments. It is apparent that various modifications, improvements, combinations, and the like can be made by those skilled in the art.

What is claimed is:

1. A semiconductor laser device comprising:
    a low clad layer made of semiconductor material of a first conductivity type and formed on or over a semiconductor substrate;
    an active layer formed on or over the low clad layer, the active layer being constituted by alternately stacking a strained well layer and a barrier layer having a larger bandgap than the strained well layer, and a partial or whole thickness of the active layer being periodically removed along a first direction parallel to a surface of the semiconductor substrate to form a diffraction grating;
    a filler made of semiconductor material embedded in the removed region of the active layer, strain of the strained well layer and strain of the filler having a same sign; and
    an upper clad layer formed on or over the active layer and the filler and made of semiconductor material of a second conductivity type opposite to the first conductivity type.

2. A semiconductor laser device according to claim 1, wherein a strain amount of the filler is approximately equal to an average strain amount of strain amounts of the strained well layer and the barrier layer of the active layer weighted by thicknesses of the strained well layer and the barrier layer.

3. A semiconductor laser device according to claim 1, wherein the semiconductor substrate is made of InP and the filler is made of InGaAsP or AlGaInAs.

4. A semiconductor laser device according to claim 1, wherein the semiconductor substrate is made of InP, the strained well layer has compressive strain and the filler is made of InAsP.

5. A semiconductor laser device according to claim 1, wherein the semiconductor substrate is made of InP, the strained well layer has tensile strain and the filler is made of InGaP.

6. A semiconductor laser device according to claim 1, wherein the semiconductor substrate is made of GaAs and the filler is made of a semiconductor material selected from a group consisting of InGaAsP, AlGaInP and InGaP.

7. A semiconductor laser device according to claim 1, wherein a thickness of the filler is equal to a depth of the removed region of the active layer.

8. A semiconductor laser device according to claim 1, wherein:
    at least the active layer and the upper clad layer have a mesa structure elongated along the first direction; and
    the semiconductor laser device further comprises:
    an antireflection film formed on one first end face of the mesa structure; and
    a high reflection film formed on the other second end face of the mesa structure, a reflectivity at the second end face being set higher than a reflectivity at the first end face in an oscillation wavelength range of the active layer.

9. A semiconductor laser device according to claim 2, wherein the semiconductor substrate is made of InP and the filler is made of InGaAsP or AlGaInAs.

10. A semiconductor laser device according to claim 2, wherein the semiconductor substrate is made of InP, the strained well layer has compressive strain and the filler is made of InAsP.

11. A semiconductor laser device according to claim 2, wherein the semiconductor substrate is made of InP, the strained well layer has tensile strain and the filler is made of InGaP.

12. A semiconductor laser device according to claim 2, wherein the semiconductor substrate is made of GaAs and the filler is made of a semiconductor material selected from a group consisting of InGaAsP, AlGaInP and InGaP.

13. A semiconductor laser device according to claim 2, wherein a thickness of the filler is equal to a depth of the removed region of the active layer.

14. A semiconductor laser device according to claim 2, wherein:
    at least the active layer and the upper clad layer have a mesa structure elongated along the first direction; and
    the semiconductor laser device further comprises:
    an antireflection film formed on one first end face of the mesa structure; and
    a high reflection film formed on the other second end face of the mesa structure, a reflectivity at the second end face being set higher than a reflectivity at the first end face in an oscillation wavelength range of the active layer.

* * * * *